(12) United States Patent
Romig et al.

(10) Patent No.: US 9,111,845 B2
(45) Date of Patent: *Aug. 18, 2015

(54) INTEGRATED CIRCUIT PACKAGE WITH PRINTED CIRCUIT LAYER

(71) Applicant: Texas Instruments Incorporated, Dallas, TX (US)

(72) Inventors: Matthew David Romig, Richardson, TX (US); Lance Cole Wright, Allen, TX (US); Leslie Edward Stark, Rowlett, TX (US); Frank Stepniak, Allen, TX (US); Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/468,370

(22) Filed: Aug. 26, 2014

(65) Prior Publication Data

US 2014/0361402 A1    Dec. 11, 2014

Related U.S. Application Data

(63) Continuation of application No. 13/723,874, filed on Dec. 21, 2012, now Pat. No. 8,847,349.

(51) Int. Cl.
*H01L 29/00* (2006.01)
*H01L 23/00* (2006.01)
*H01L 49/02* (2006.01)
*H01L 23/28* (2006.01)
*H01L 23/522* (2006.01)
*H05K 1/16* (2006.01)

(52) U.S. Cl.
CPC ............... *H01L 24/17* (2013.01); *H01L 23/28* (2013.01); *H01L 23/5226* (2013.01); *H01L 24/32* (2013.01); *H01L 24/48* (2013.01); *H01L 28/00* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2924/1205* (2013.01); *H01L 2924/1206* (2013.01); *H01L 2924/1207* (2013.01); *H01L 2924/14* (2013.01); *H01L 2924/15183* (2013.01); *H01L 2924/15311* (2013.01); *H05K 1/16* (2013.01)

(58) Field of Classification Search
CPC ......... H01L 24/17; H01L 24/32; H01L 23/28; H01L 23/15; H01L 23/5228; H01L 27/01
USPC ........................................ 257/528, 379, 516
See application file for complete search history.

(56) References Cited

U.S. PATENT DOCUMENTS 8,847,349 B2 * 9/2014 Romig et al. ................. 257/528
2004/0155322 A1 * 8/2004 Cho et al. ...................... 257/676
2006/0154434 A1 * 7/2006 Das et al. ...................... 438/393

* cited by examiner

*Primary Examiner* — Tu-Tu Ho
(74) *Attorney, Agent, or Firm* — Steven A. Shaw; Frank D. Cimino

(57) ABSTRACT

An integrated circuit (IC) package including an IC die and a conductive ink printed circuit layer electrically connected to the IC die.

13 Claims, 9 Drawing Sheets

INTEGRATED CIRCUIT PACKAGE WITH PRINTED CIRCUIT LAYER

CROSS-REFERENCE TO RELATED APPLICATIONS

This application is a continuation of and claims priority to U.S. patent Ser. No. 13/723,874 filed Dec. 21, 2012. Said application incorporated herein by reference.

BACKGROUND

Many integrated circuit ("IC") packages include a single IC die mounted on a leadframe or other conductive substrate to which the IC die is electrically connected. The die is a small semiconductor block that contains a circuit that performs a predetermined function. The leadframe or other electrical substrate enables the circuit in the die to be connected to external circuits which are typically provided on a printed circuit board or other electrical assembly to which the IC package is electrically attached. The IC package generally also includes a layer of hard, nonconductive encapsulating material which protects the die and electrical substrate.

IC dies contain active circuit elements, such as transistors, that act on a signal input to the die. It is sometimes desirable to pass a signal through passive circuit elements such as resistors and capacitors either before the signal is input to the die or after the signal leaves the die. One way to do this is to provide one or more passive circuit elements within the IC package. The passive circuit elements might be, for example, an etched or plated metal circuit layer or a discrete circuit device attached to the die.

DETAILED DESCRIPTION

This disclosure, in general, describes an integrated circuit (IC) package 11 that includes an IC die 12, a signal routing circuit layer 22 electrically connected to the IC die 12; and a conductive ink printed passive circuit layer 122 electrically connected to the signal routing circuit layer 22. Also described is a method of making an IC package 11 that includes printing a passive circuit layer 122 with conductive ink onto a nonconductive layer, e.g. 32, 42, of an IC package 11 and electrically connecting an IC die 12 to the passive circuit layer 122, as through a signal routing circuit layer 22. Having thus described an IC package and a method of making an IC package generally, various embodiments thereof will now be described in detail.

Figure 1:
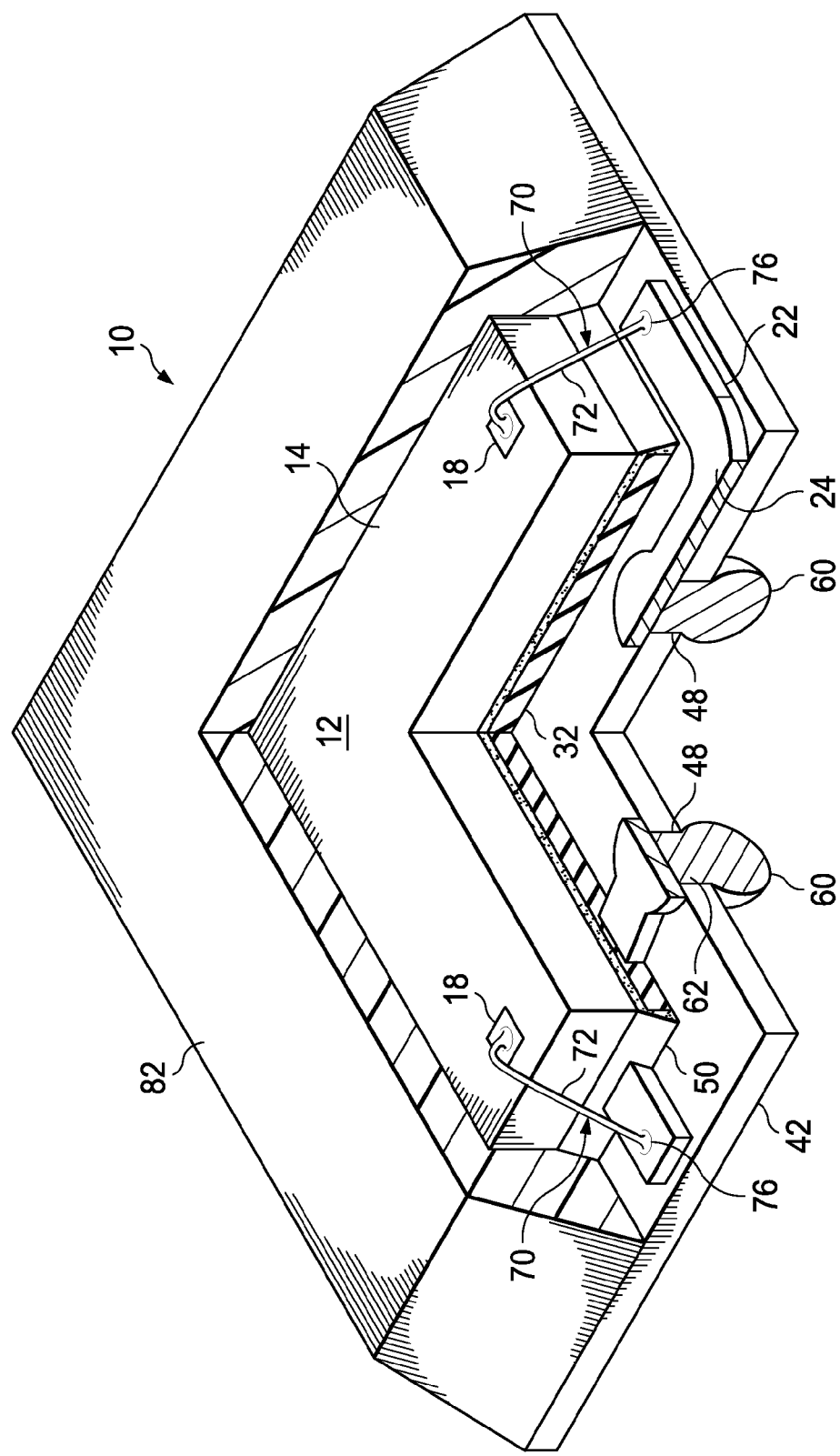
FIG. 1 is a cutaway perspective view of a conventional IC package.
Figure 2:
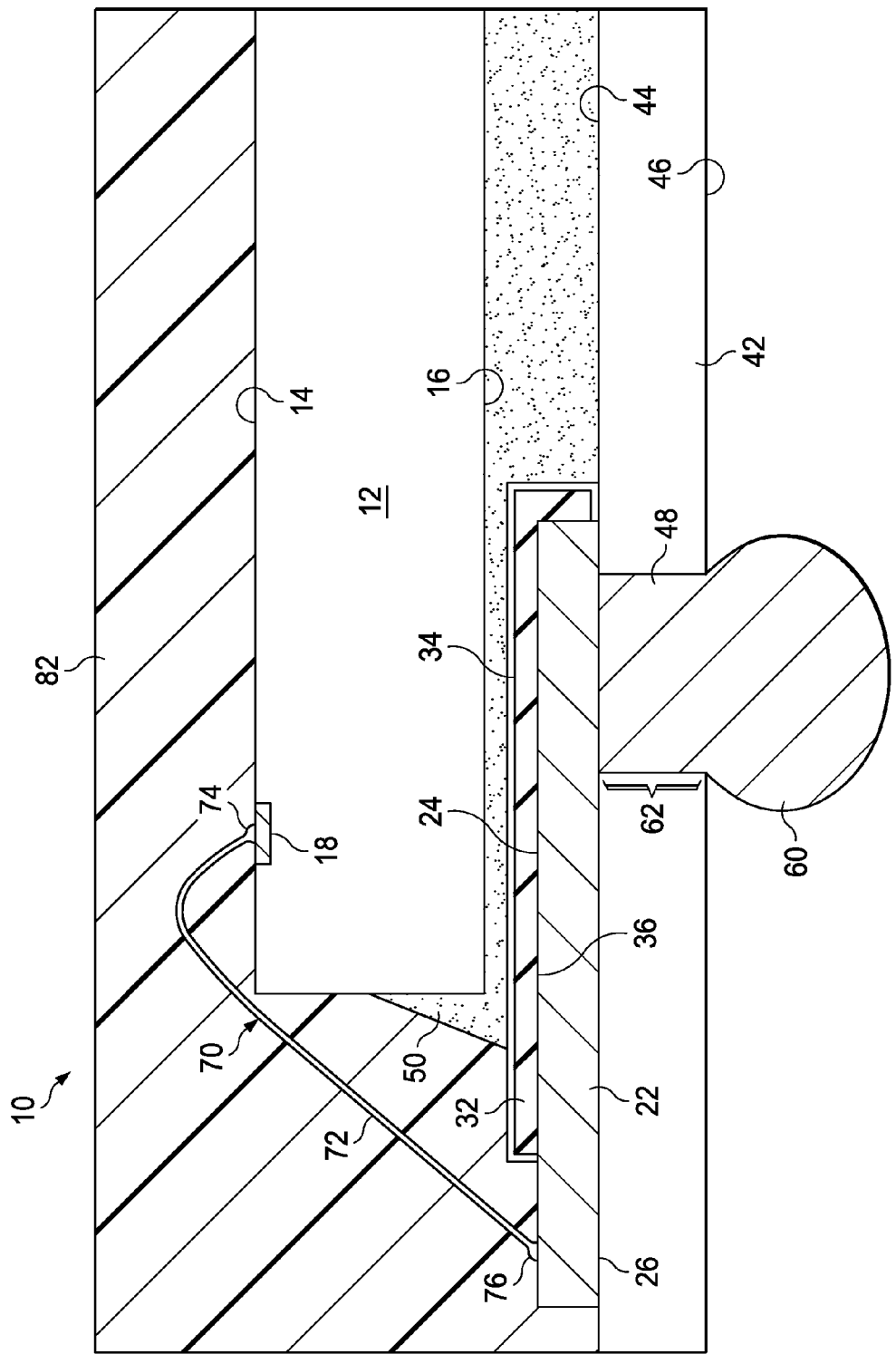
FIG. 2 is a cross sectional view of a portion of the IC package of FIG. 1.
Figure 4:
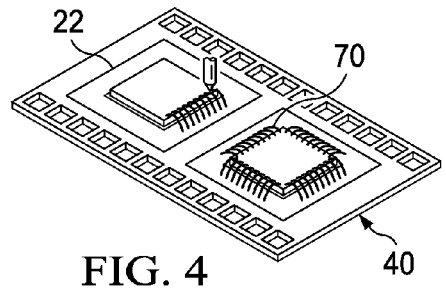
FIG. 4 is a schematic representation of a wire bond step in the process of making a conventional IC package.

FIG. 1 is a partially cutaway view of a conventional integrated circuit (IC) package 10, and FIG. 2 is a cross sectional elevation view of a portion of the IC package of FIG. 1. As best illustrated by FIG. 2, the IC package 10 includes an IC die 12 having a top surface 14 and a bottom surface 16. A plurality of contact pads 18 (only one shown in FIG. 2) are provided on the top surface 14. An etched metal signal routing circuit layer 22 (hereinafter referred to as "signal routing circuit layer 22") is positioned below the IC die 12 and extends laterally outwardly beyond the IC die 12. The signal routing circuit layer 22 has a top surface 24 and a bottom surface 26. An insulating layer 32, which may be a solder resist layer and which is sometimes referred to herein as "solder resist layer 32," is positioned directly above the signal routing circuit layer 22. The insulating layer 32 has a top surface 34 and a bottom surface 36. The top surface 24 of the signal routing circuit layer 22 interfaces with the bottom surface 36 of the insulating layer 32. A package substrate layer 42 having a top surface 44 and a bottom surface 46 is positioned below the signal routing circuit layer 22 with the top surface 44 of the substrate 42 interfacing with the bottom surface 26 of the signal routing circuit layer 22. A via 48 extends through the substrate 42 in an area below the signal routing circuit layer 22. A solder ball 60 is positioned immediately below the via 48 and has a solder ball riser portion 62 extending through the via 48. The riser portion 62 is in electrical contact with the signal routing circuit layer 22. The IC die 12 is electrically connected to the signal routing circuit layer 22 by a plurality of wire bonds 70. Each wire bond 70 includes a thin lead wire 72 which is connected at one end to a contact pad 18 on the IC die 12 by a first weld 74. The wire 72 is connected at a second end to a top surface portion of the signal routing circuit layer 22 by a second weld 76. The die 12 has a multiple contact pads 18 (only two shown in FIG. 1) that are wire bond connected to multiple points on the circuit layer 22, as shown in FIGS. 1 and 4.

As best shown in FIG. 2, an epoxy layer 50 attaches the IC die 12 to portions of the solder resist layer 32 and package substrate 42.

A solidified mold compound 82, sometimes referred to herein as encapsulant 82, sealingly covers the IC die 12, epoxy layer 50, solder resist layer 32, signal routing circuit layer 22 and wire bonds 70.

Figure 3:
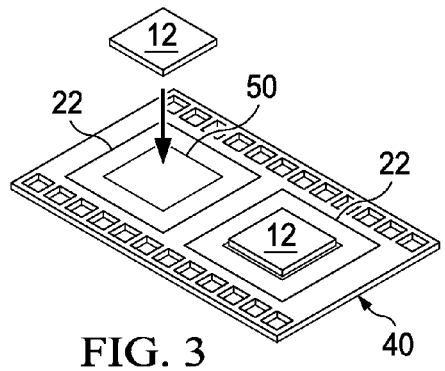
FIG. 3 is a schematic representation of a die attach step in a process of making a conventional IC package such as shown in FIGS. 1 and 2.

The principal process steps for making an IC package 10, such as illustrated in FIGS. 1 and 2, are shown schematically in FIGS. 3-7. FIG. 3 illustrates a die attach process. A strip 40 of substrate material such as, for example, polyimide tape, has a plurality of spaced apart circuit layers 22 patterned thereon, typically by a multi-step photoresist and etching process well known in the art. The solder resist layer 32 (not shown in FIG. 3) is applied over a portion of the circuit layer 22. Next, the epoxy layer 50 is applied, as with an automated syringe, in an area having a slightly larger periphery than the footprint of an IC die 12 which is to be applied thereto. The epoxy 50 covers most or all of the solder resist layer 32. Next, the IC die 12 is applied to the epoxy 50 covered area of each signal routing circuit layer 22, typically by use of a pick-and-place machine. The substrate strip 40 is then moved to a curing oven where the epoxy 50 is cured and thus firmly holds the die 12 in place.

The next step in the process as shown by FIG. 4 is wire bonding. In this process, each die 12 on the substrate strip 40 has contact pads 18 on the top surface thereof electrically attached to a predetermined portion of the signal routing circuit layer 22 by wire bonds 70. Wire bond attachment of dies to electrical circuit layers is well known in the art.

Figure 5:
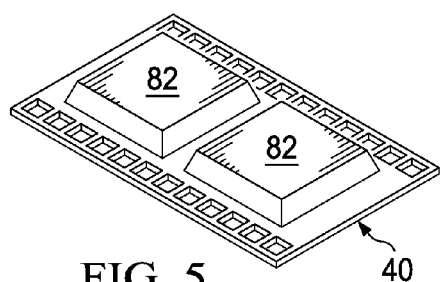
FIG. 5 is a schematic representation of a molding step in the process of making conventional IC package.

As illustrated by FIG. 5, the substrate strips 40 are next moved to a mold station, such as a transfer mold, where a layer of mold compound 82, sometimes referred to herein as "encapsulant." is applied, which covers the dies 12, wire bonds 70, circuit layers 22 and solder resist layers 32 as well as the epoxy 50 and top surface 44 of the substrate strip 40.

Figure 6:
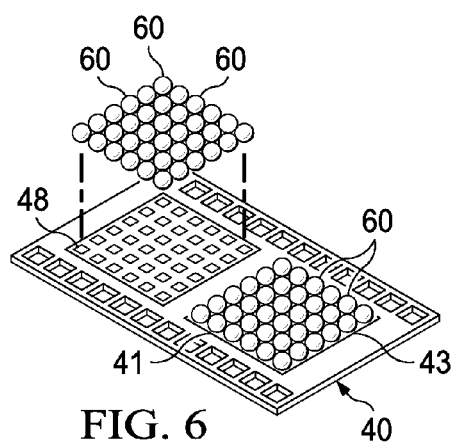
FIG. 6 is a schematic representation of a ball attach step in the process of making a conventional IC package.
Figure 7:
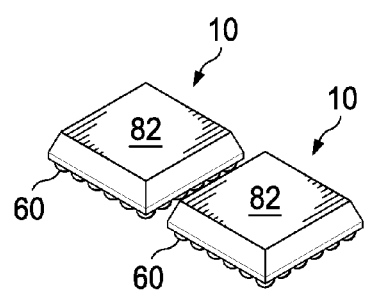
FIG. 7 is a schematic representation of a singulation step in the process of making a conventional IC package.

Next, as illustrated by FIG. 6, the substrate strip 40 undergoes a ball attach process. In this process, the substrate strip 40 is flipped over, exposing a plurality of via holes 48 that were punched in the bottom surface of the strip 40 prior to the die attachment. A solder ball 60 is positioned over each of the vias 48 and attached through a riser portion 62, extending through the via 48, to the signal routing circuit layer 22, FIG. 1. Such ball grid attachment is widely practiced in the art. Next, as illustrated in FIG. 7, the substrate strip 40 is singulated along saw streets corresponding generally to lines 41 and 43 in FIG. 6. The singulation produces individual IC packages 10.

The structure of the IC package 10, as shown in FIGS. 1 and 2, and the method of making it, as illustrated schematically in FIGS. 3-7, are known in the art. As mentioned earlier, the process by which the signal routing circuit layer 22 is produced is a time consuming process involving multiple high precision steps involving application of photoresist patterns, chemical etching, etc., or various metal plating process steps, which are all known in the art. Similarly, the processes by which circuits are formed within die 12 are very high precision operations that include multiple forming steps. The dies 12 connected to such circuit layers 22 have embedded circuits which perform specific functions. It is sometimes desirable to add further circuitry to an IC package beyond that which is contained in the die 12. There are various ways of adding circuit components. One way is to add such components to the die circuitry during die formation. Another way is to provide another circuit layer that is formed by etching or plating similar to circuit layer 22, but which includes passive circuit elements that are electrically connected to the die circuitry. Both of these options are very expensive. One advantage of providing a new circuit layer, either to the die 12 or to the package 10 external of the die, is that the new circuit layer fits within the existing footprint of the IC package 10. The added circuit layer for the most part does not significantly increase the height of the package 10. A disadvantage of adding circuitry in this manner is that the etching, etc. or metal plating of another circuit layer, either internal or external of the die 12, adds considerably to the expense of the IC package 10.

Applicants have developed a method of providing an additional circuit layer to an IC package, which has the same advantages as adding an etched or plated metal circuit layer but at a much lower cost. The method involves ink printing of passive circuit elements onto a layer of nonconductive material such as solder resist. The method uses conductive ink which may be printed either by screen printing or by ink jet printing. The additional circuit layer may be provided at different locations within the IC package as will be described with reference to FIGS. 9-12 below. Various passive circuit elements such as capacitors, resistors and inductors may be provided by selecting an appropriate ink pattern as described below with reference to FIGS. 13-15.

The below-described conductive ink printed passive circuits 122 may all be formed by ink jet printing or screen printing. The printing of conductive ink on a two dimensional surface using an inkjet printer is known in the art as described in U.S. patent application publication no. U.S. 2010/0059251 published Mar. 11, 2010 for "Printed Circuit Board and Manufacturing Method" of Sergey Remizov, et al.; U.S. 2010/0149249 published Jun. 17, 2010 for "Surface Treatment Method, Circuit Lines Formation Method, Circuit Lines Formation Apparatus and Printed Circuit Board Formed Thereby" of Yoon-Ah Baik, et al.; U.S. 2011/0042125 published Feb. 24, 2011 for "Conductive Ink, Method of Preparing Medal Wiring Using Conductive Ink, and Printed Circuit Board Prepared Using Method" of Jong-Hee Lee, each of which is hereby incorporated by reference for all that is disclosed therein. Inkjet printing of conductive ink traces on an electrical substrate is also disclosed in U.S. patent application Ser. No. 13/591,719 filed Aug. 22, 2012 for ELECTRONIC ASSEMBLY WITH THREE DIMENSIONAL INKJET PRINTED TRACES of Mathew David Romig, et al., which is hereby incorporated by reference for all that it discloses.

Various ink formulations that may be used to inkjet print conductive traces are known in the art, such as those disclosed in the above patent publications incorporated by reference. Another such ink formulation suitable for printing conductive traces is disclosed in U.S. Patent Application U.S. 2010/0178420 published Jul. 15, 2010, which is hereby incorporated by reference for all that is disclosed therein. Other suitable inkjet ink formulations are commercially available from various manufacturers such as DuPont, Microcircuit Materials, 14 T. W. Alexander Dr., Research Triangle Park, MC 27709. One such DuPont inkjet ink is sold under the product designation 5000 Silver Conductor.

Figure 8:
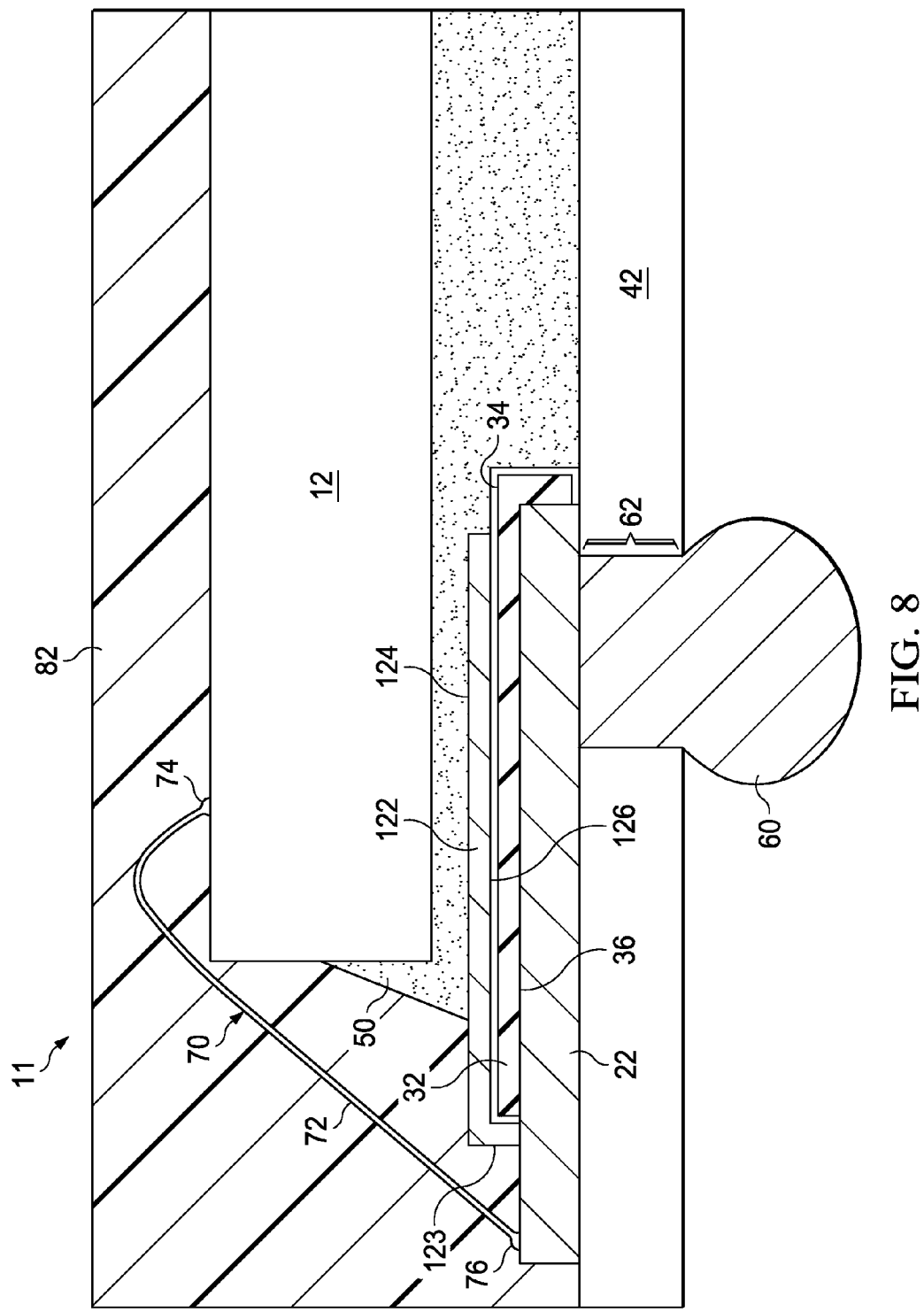
FIG. 8 is a schematic cross sectional representation of an IC package having a conductive ink passive circuit layer printed on a solder resist layer and connected to a peripheral portion of a patterned metal layer.

Returning now to the drawings, FIG. 8 is a cross sectional schematic view of an IC package 11 having a conductive ink printed passive circuit 122 provided therein. In the embodiment of FIG. 8, components of the IC package 11 that are the same as those shown in the IC package 10 of FIG. 2 are labeled with the same reference numerals. In this embodiment, the configuration of the package 11 shown in FIGS. 8-11 may be generally the same as the package 10 shown in FIG. 2, except that a conductive ink passive circuit layer 122 is printed on top of a nonconductive layer, e.g. 32 of the package. The printed circuit layer 122 has a top surface 124 and a bottom surface 126. The top surface 124 interfaces with the epoxy layer 50 and the layer of mold compound 82. An end portion 123 extends laterally outwardly beyond the solder resist layer 32 and downwardly to make contact with the signal routing circuit layer 22. With regard to the method for applying this printed circuit layer 122, in one embodiment, it is printed on to the solder resist layer 32 prior to application of the epoxy 50. In some embodiments, the printed circuit layer 122 is cured in a separate heating step as by moving the associated substrate strip, which may be similar to strip 40 in FIGS. 3-7, to a heat source such as a drying oven (not shown) where it is heated for a predetermined period of time and at a predetermined temperature selected for curing of the particular conductive ink used. In another embodiment, the epoxy 50 is applied over the printed circuit layer 122 The printed circuit layer 122 is then cured at the same time as the epoxy 50 as by a conventional epoxy curing operation. The remainder of the IC package 11 forming steps may be generally the same as described above with reference to FIGS. 3-7 for the IC package 10.

Figure 9:
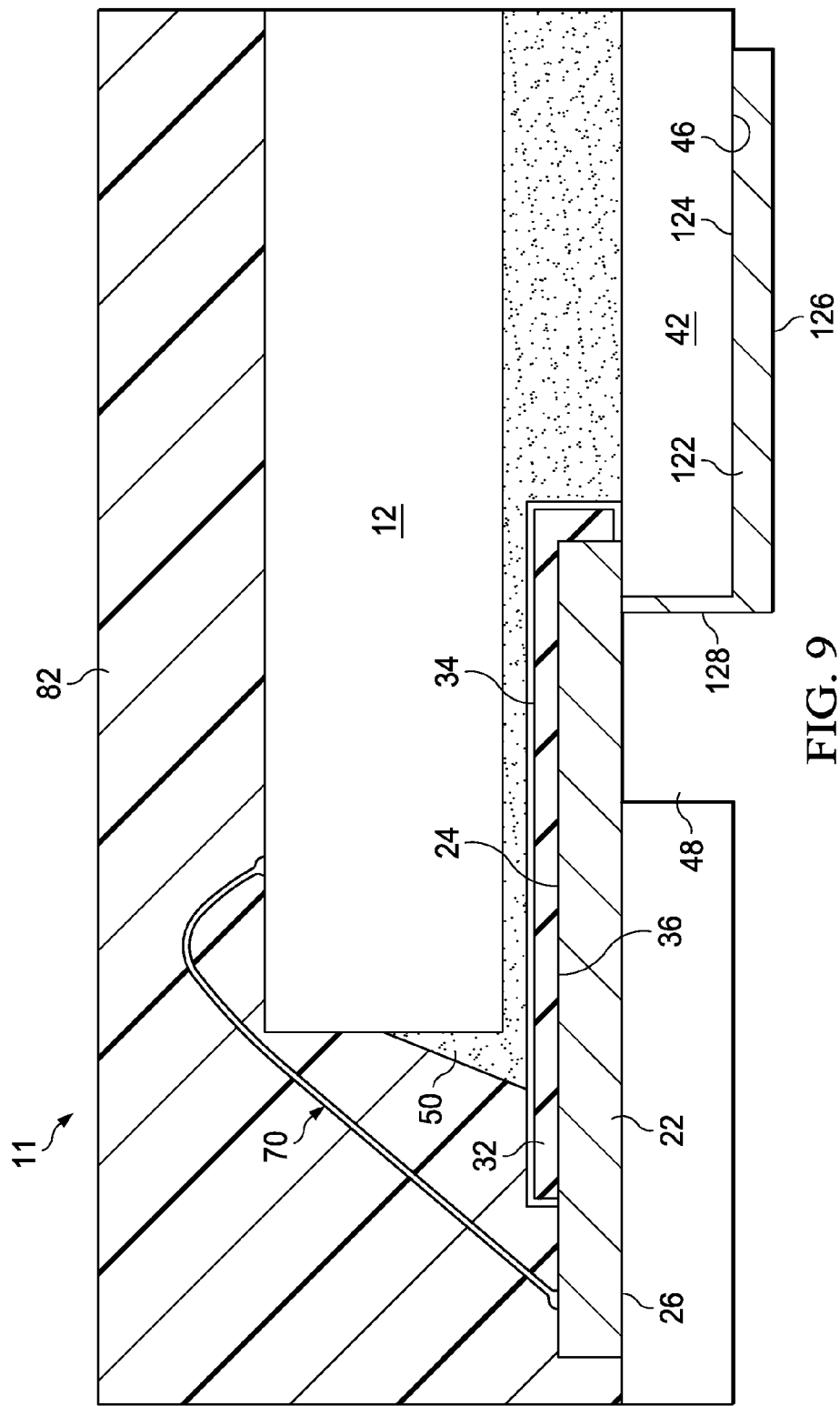
FIG. 9 is a schematic cross sectional representation of an IC package having a conductive ink passive circuit layer printed on a package substrate layer and connected to a patterned metal layer by a riser extending through a via.
Figure 10:
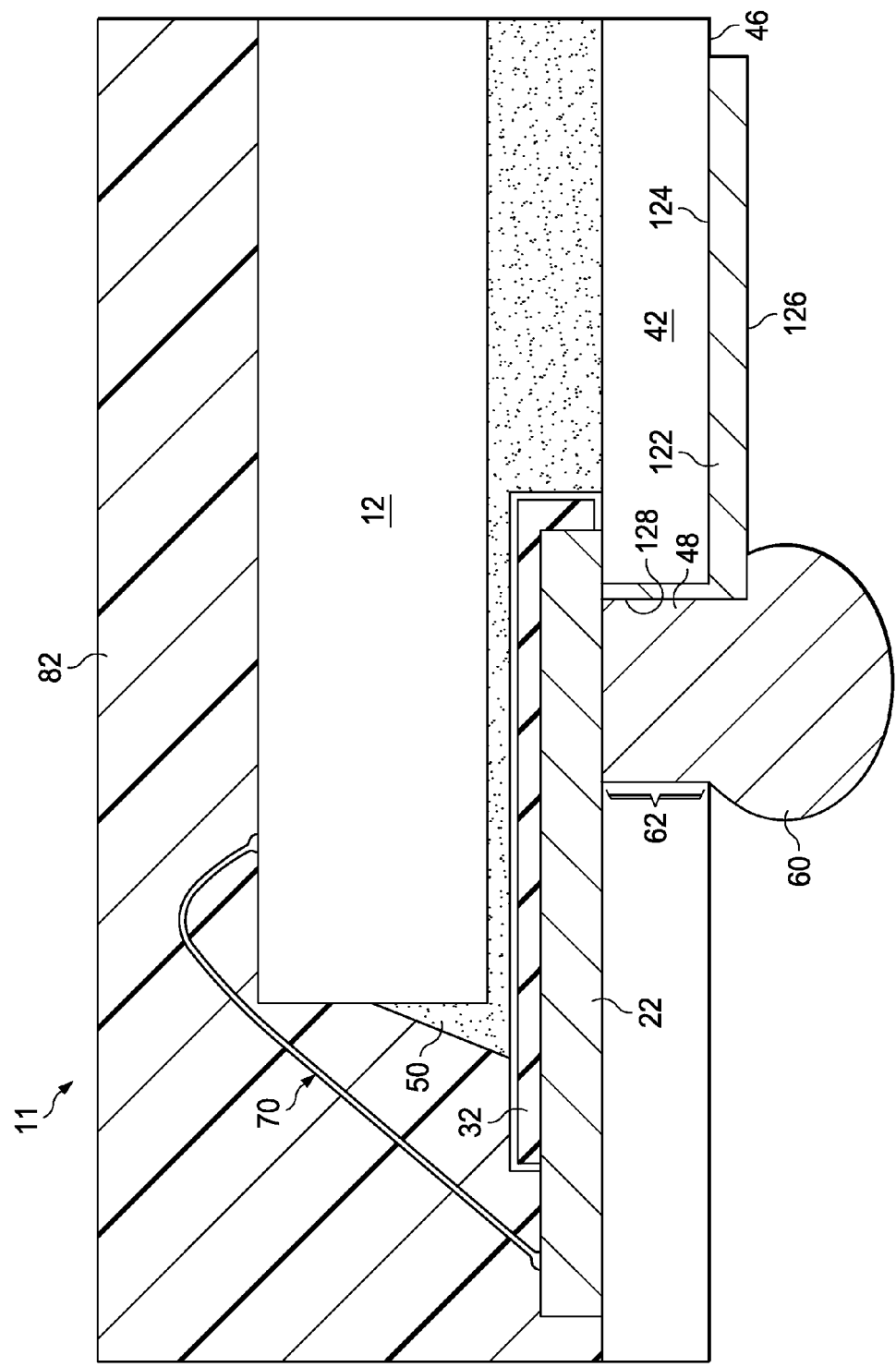
FIG. 10 is a schematic cross sectional representation of an IC package having a conductive ink passive circuit layer printed on a package substrate layer and connected to a patterned metal layer by a riser extending through a via with a solder ball also connected to the patterned metal layer through the via.

Another embodiment of a method of applying a conductive ink printed passive circuit layer 122 is illustrated in FIG. 9. As shown in FIG. 9, the passive circuit layer 122 is printed on the bottom surface of the substrate layer 42 with the top surface 124 of the printed circuit layer 122 interfacing with the bottom surface 46 of the substrate 42. In one embodiment, the printed circuit layer 122 has an end riser portion 128 that extends upwardly along a surface portion of via 48. At the top of the via 48, the riser portion 128 comes into contact with a predetermined portion of the lower surface 26 of signal routing circuit layer 22. In this embodiment, there is no solder ball 60 associated with the via 48. In another embodiment, as shown by FIG. 10, an identical printed circuit layer 122 with a riser 128 extending into via 48 is provided. However, in this embodiment, a solder ball 60 has a riser portion 62 that also extends through the via 48. This embodiment essentially adds an extra layer to the outside of the package for routing passives.

Figure 11:
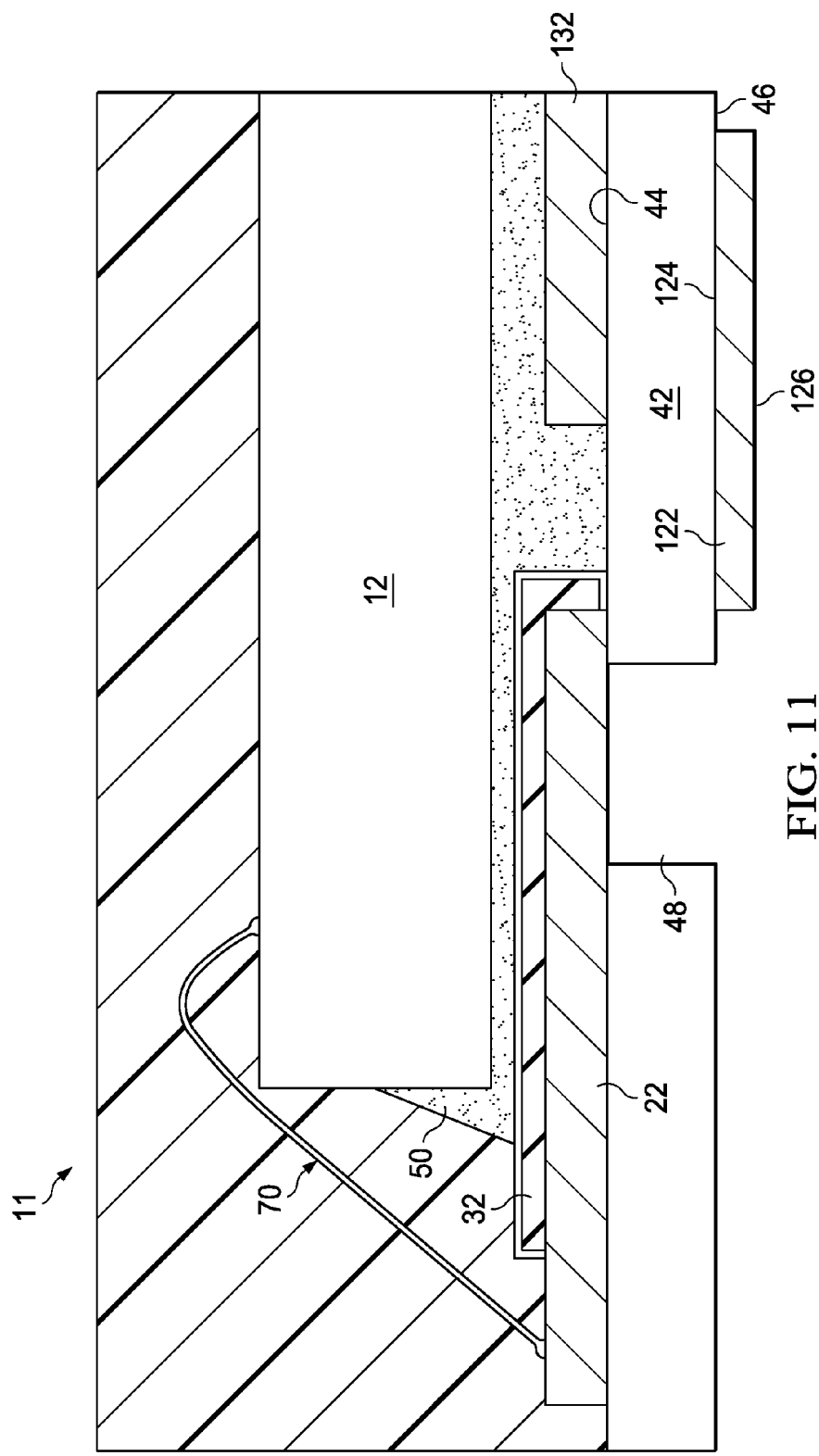
FIG. 11 is a schematic cross sectional representation of an IC package having a conductive ink passive circuit layer printed on a package substrate layer.

FIG. 11 illustrates an embodiment in which the printed circuit layer 122 is printed on the bottom surface 46 of substrate 42 adjacent to a via 48. In this embodiment, the printed circuit layer 122 acts as a first capacitive plate and a plate 132 acts as a second capacitor plate. Plate 132 may be a separate substrate with a plated or etched metal layer thereon or it may be a layer of conductive ink that is printed on the upper surface 44 of the substrate 42. Substrate 42 acts as the dielectric layer of this capacitor. Both circuit layer 122 and plate 132 may be connected to the signal routing circuit layer 22 or directly to the die 50 by conventional connection means (not shown).

Figure 12:
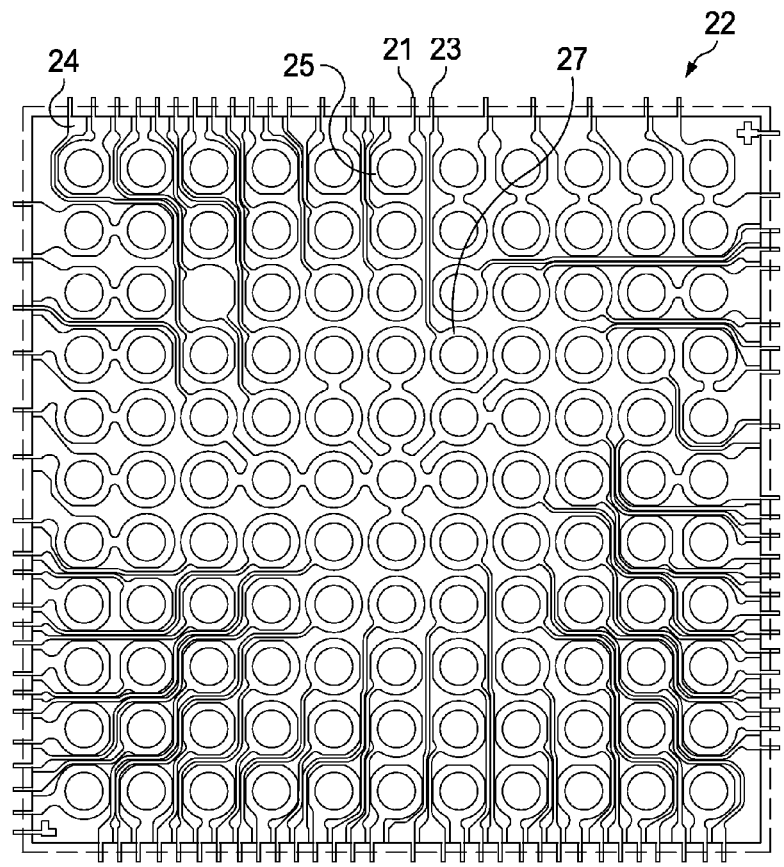
FIG. 12 is a top plan view of a patterned metal layer of an IC package.
Figure 13:
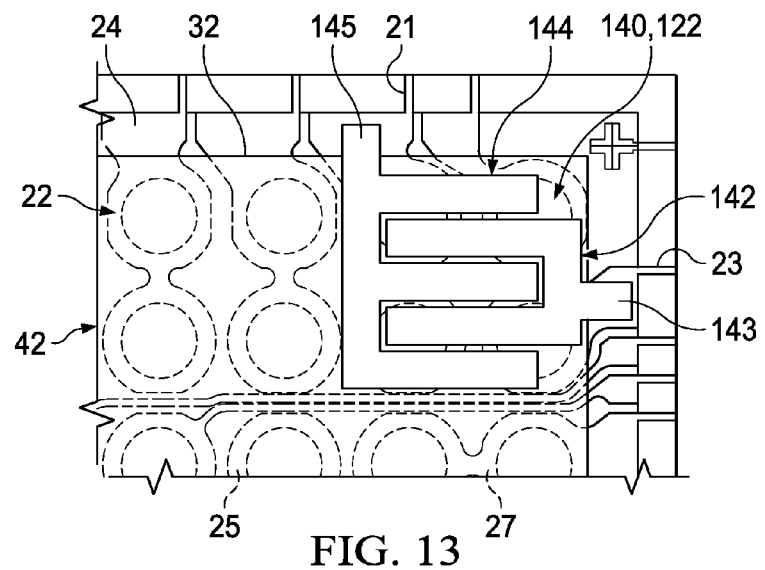
FIG. 13 is a detail plan view of a passive circuit element printed on a layer of nonconductive material and connected to a patterned metal layer.

The formation of certain passive circuit elements that are provided by the printed circuit layer 122 will now be described. FIG. 12 illustrates a typical etched signal routing circuit layer 22 having a plurality of signal traces. The traces may have end portions, e.g., 21, 23 terminating at the outer periphery of this layer and may have interior portions, e.g., 25, 27 which are adapted to be connected to balls 60 of the ball grid array provided on the bottom of the circuit package 11, FIG. 8. In the embodiment of FIG. 8, a nonconductive layer, such as solder resist layer 32, is applied on the top surface of signal routing circuit layer 22. Next, a predetermined pattern such as comb capacitor pattern 140, FIG. 13, is printed onto the solder resist layer 32 as by ink jet printing or screen printing of conductive ink. (Signal routing circuit layer 22 is shown in dashed lines in FIG. 13 because it is covered by the solder resist layer 32.) The comb capacitor 140 has a first portion 142 with an E-shaped configuration and a second portion 144 with a generally U-shaped configuration. The first portion 142 has a terminal end 143 in contact with trace 23 of signal routing circuit layer 22. The second portion 144 has a terminal end 145 in contact with trace 21 of signal routing circuit layer 22. It will be seen from FIG. 13 that the terminal ends 143 and 145 of the printed circuit layer 122 may extend beyond the edge of the solder resist layer 32.

Figure 14:
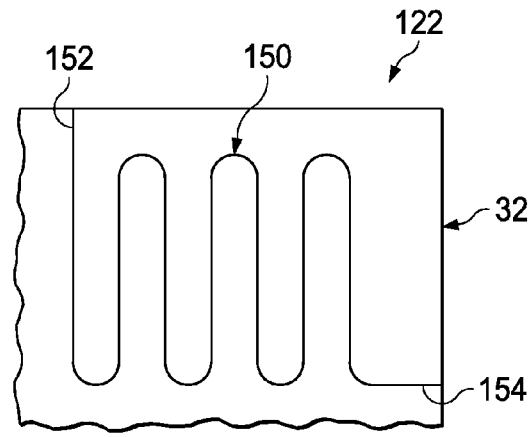
FIG. 14 is a schematic plan view of another passive circuit element printed on a layer of nonconductive material.

FIG. 14 schematically illustrates a printed layer 122 having a serpentine pattern which provides a resistor 150. The resistor 150 has terminal ends 152 and 154 connected to signal routing circuit layer 22.

Figure 15:
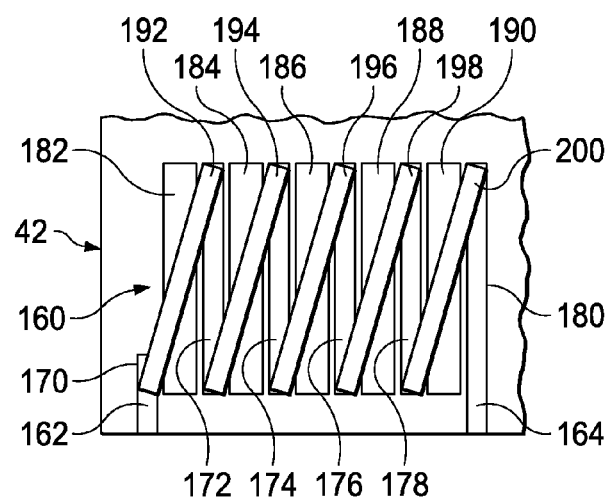
FIG. 15 is a plan view of a passive circuit element provided on a substrate.
Figure 16:
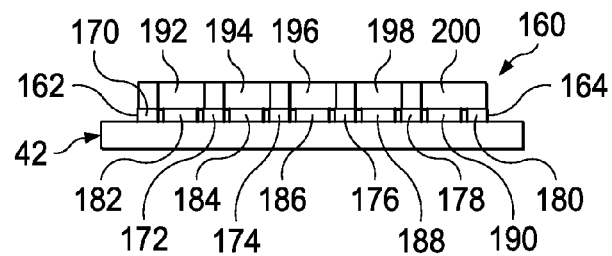
FIG. 16 is a side elevation view of the passive circuit element of FIG. 15.

FIG. 15 is a top plan view of a substrate, e.g., 42, with a printed pattern 160 that emulates an inductor coil. FIG. 16 is a side elevation view thereof. The pattern 160 has terminals 162 and 164 connected to signal routing circuit layer 22. The pattern 160 is provided on top of a nonconductive layer, such as substrate 42 in the package embodiment of FIG. 9. The pattern 160 includes linear electrical traces 170, 172, 174, 176, 178, 180 formed on the surface of the substrate 42 as by metal etching or metal plating or by printing of conductive ink traces. The pattern further includes strips of insulating material 182, 184, 186, 188, 190, which may be solder resist or other dielectric material provided by conventional methods or by inkjet printing or screen printing of dielectric ink. The strips of insulating material 182, 184, etc. are positioned on the substrate 42 between the electrical traces 170, 172, etc. and may have substantially the same height as the electrical traces. The pattern further includes printed conductive ink traces 192, 194, 196, 198, 200 extending between and electrically connecting end portions of electrical traces 170, 172, 174, etc. The printed traces 192, 194, etc., are provided on top of the insulating strips 182, 184, etc. It will be understood that if substrate 42 of FIG. 9 is provided with this pattern 160 that the views of FIGS. 15 and 16 should be inverted.

It will be appreciated by those skilled in the art after reading this disclosure that a new method of providing passive circuit elements in an IC package has been described. This method provides a relatively low cost way of "customizing" an integrated circuit package after the IC die has been formed. Thus various passive circuit elements can be added to the active circuit of the die after it has been produced and at a relatively low cost. In other words the same die configuration can be used with different passive circuits to provide a variety of different circuits within IC packages that all have essentially the same size and shape. Since different circuits can be provided without designing and constructing different dies for the different IC packages and without making exterior passive circuits through the usual prior art method of etching a separate metal layer on an interior surface of the package, a considerable savings in production time and cost can be achieved. A printed passive circuit layer does not have the high resolution of an etched metal circuit, but such resolution is not necessary for passive circuits at the package level. Thus applicants' printed passive circuit layer performs the same function as an etched passive circuit layer, but at a fraction of the time and cost.

While certain specific embodiments of an IC package with a conductive ink printed circuit layer are described in detail herein, it will be appreciated by those skilled in the art that an IC package with a conductive ink printed circuit layer could be otherwise constructed. For example rather than having a circuit routing layer that is adapted to be attached to a ball grid array, the IC package could have a leadframe electrically connected to the die and the printed circuit layer. The printed circuit layer could be printed on a nonconductive layer disposed above or below the lead frame, with the printed circuit layer electrically connected to the lead frame. The claims are intended to be broadly construed to cover all such alternative embodiments, except as limited by the prior art.

What is claimed is:

1. An integrated circuit ("IC") package comprising:
   an IC die having an upper surface with a plurality of contact pads thereon and a bottom surface;
   an etched metal signal routing layer positioned below said bottom surface of said die and having a top surface and a bottom surface;
   a tape substrate positioned below said IC die and said signal routing layer and having a top surface and a bottom surface and having a plurality of vias extending between said top and bottom surfaces thereof;
   at least one resist layer provided on one of said tape substrate and said signal routing layer;
   a conductive ink printed circuit layer printed on one of said tape substrate and said resist layer and electrically connected to said signal routing layer;
   an encapsulation layer encapsulating said IC die, said signal routing layer, said conductive ink printed layer and at least a portion of said tape substrate; and
   an array positioned below said tape substrate and electrically attached to said signal routing layer through said vias, wherein said die is wire bond attached to said etched metal signal routing layer.

2. The IC package of claim 1 wherein said die is positioned above said signal routing layer and said conductive ink printed circuit layer is positioned between said die and said signal routing layer.

3. An integrated circuit ("IC") package comprising:
   an IC die having an upper surface with a plurality of contact pads thereon and a bottom surface;
   a plated metal signal routing layer positioned below said bottom surface of said die and having a top surface and a bottom surface;
   a tape substrate positioned below said IC die and said signal routing layer and having a top surface and a bottom surface and having a plurality of vias extending between said top and bottom surfaces thereof;
   at least one resist layer provided on one of said tape substrate and said signal routing layer;
   a conductive ink printed circuit layer printed on one of said tape substrate and said resist layer and electrically connected to said signal routing layer;
   an encapsulation layer encapsulating said IC die, said signal routing layer, said conductive ink printed layer and at least a portion of said tape substrate; and
   an array positioned below said tape substrate and electrically attached to said signal routing layer through said vias,
   wherein said die is wire bond attached to said plated metal signal routing layer.

4. An integrated circuit ("IC") package comprising:
   an IC die having an upper surface with a plurality of contact pads thereon and a bottom surface;
   a signal routing layer positioned below said bottom surface of said die and having a top surface and a bottom surface;
   a tape substrate positioned below said IC die and said signal routing layer and having a top surface and a bottom surface and having a plurality of vias extending between said top and bottom surfaces thereof;
   at least one resist layer provided on one of said tape substrate and said signal routing layer;
   a conductive ink printed circuit layer printed on one of said tape substrate and said resist layer and electrically connected to said signal routing layer, wherein said printed circuit layer includes a passive circuit element;
   an encapsulation layer encapsulating said IC die, said signal routing layer, said conductive ink printed layer and at least a portion of said tape substrate; and
   an array positioned below said tape substrate and electrically attached to said signal routing layer through said vias.

5. The IC package of claim 4, said passive circuit element comprising at least one of a capacitor, a resistor and an inductor.

6. An integrated circuit ("IC") package comprising:
   an IC die having an upper surface with a plurality of contact pads thereon and a bottom surface;
   a signal routing layer positioned below said bottom surface of said die and having a top surface and a bottom surface;
   a tape substrate positioned below said IC die and said signal routing layer and having a top surface and a bottom surface and having a plurality of vias extending between said top and bottom surfaces thereof;
   at least one resist layer provided on one of said tape substrate and said signal routing layer;
   a conductive ink printed circuit layer printed on one of said tape substrate and said resist layer and electrically connected to said signal routing layer;
   an encapsulation layer encapsulating said IC die, said signal routing layer, said conductive ink printed layer and at least a portion of said tape substrate; and
   an array positioned below said tape substrate and electrically attached to said signal routing layer through said vias,
   wherein said die is positioned above said signal routing layer and said conductive ink printed circuit layer is positioned below said signal routing layer.

7. The IC package of claim 6 wherein said signal routing layer is an etched metal signal routing layer.

8. The IC package of claim 6 wherein said signal routing layer is a plated metal signal routing layer.

9. The IC package of claim 7, wherein said die is wire bond attached to said etched metal signal routing layer.

10. The IC package of claim 6 further comprising a substrate positioned between said signal routing layer and said conductive ink printed circuit layer.

11. The IC package of claim 10, said substrate having a bottom surface, wherein said conductive ink printed circuit layer is printed on said substrate bottom surface.

12. The IC package of claim 11 wherein said wherein said conductive ink printed circuit layer is electrically connected to said signal routing layer through a hole in said substrate.

13. The IC package of claim 11, further comprising a ball grid array having a plurality of balls positioned below said substrate and electrically attached to said signal routing layer through a plurality of vias extending through a plurality of via holes in said substrate and wherein said conductive ink printed circuit layer is electrically connected to said signal routing layer through at least one of said via holes.

* * * * *